United States Patent
Hintikka et al.

(10) Patent No.: US 7,873,506 B2
(45) Date of Patent: Jan. 18, 2011

(54) SIMULATION FRAMEWORK WITH SUPPORT FOR MULTIPLE INTEGRATED CIRCUITS HAVING POTENTIALLY DIFFERING CHARACTERISTICS

(75) Inventors: Paul N. Hintikka, Austin, TX (US); Sileshi Kassa, Georgetown, TX (US); Vinoj N. Kumar, Austin, TX (US); Ravi K. Mandava, Austin, TX (US)

(73) Assignee: Agere Systems Inc., Allentown, PA (US)

( * ) Notice: Subject to any disclaimer, the term of this patent is extended or adjusted under 35 U.S.C. 154(b) by 2224 days.

(21) Appl. No.: 10/609,781

(22) Filed: Jun. 30, 2003

(65) Prior Publication Data

US 2004/0267512 A1 Dec. 30, 2004

(51) Int. Cl.
*G06F 17/50* (2006.01)
*G06F 9/455* (2006.01)

(52) U.S. Cl. .............. 703/19; 703/16; 703/17; 703/22; 717/100; 717/135; 717/149; 716/6

(58) Field of Classification Search .......... 703/16, 703/17, 19, 22; 713/500, 502; 702/125; 714/39; 719/318; 717/100, 135, 149; 716/6
See application file for complete search history.

(56) References Cited

U.S. PATENT DOCUMENTS

| | | | | |
|---|---|---|---|---|
| 5,862,361 A * | 1/1999 | Jain | ............... | 703/16 |
| 5,917,731 A * | 6/1999 | Ferenczi et al. | ............... | 703/17 |
| 6,053,947 A * | 4/2000 | Parson | ............... | 703/14 |
| 6,134,514 A * | 10/2000 | Liu et al. | ............... | 703/17 |
| 6,263,303 B1 * | 7/2001 | Yu et al. | ............... | 703/19 |
| 6,370,494 B1 * | 4/2002 | Mizuno et al. | ............... | 703/17 |
| 6,442,740 B1 * | 8/2002 | Kanamoto et al. | ............... | 716/6 |
| 6,466,898 B1 * | 10/2002 | Chan | ............... | 703/17 |
| 7,085,703 B2 * | 8/2006 | Gabele et al. | ............... | 703/17 |
| 7,590,519 B2 * | 9/2009 | Lin et al. | ............... | 703/17 |
| 2002/0173943 A1 * | 11/2002 | Armbruster et al. | ............... | 703/15 |
| 2003/0212989 A1 * | 11/2003 | Rokosz | ............... | 717/135 |
| 2004/0024578 A1 * | 2/2004 | Szymanski et al. | ............... | 703/17 |

(Continued)

OTHER PUBLICATIONS

G. D. Nagendra, V. G. Prem Kumar, and B. S. Sheshadri, "Simulation Bridge: A Framework for Multi-processor Simulation", May 6-8, 2002, 2002 ACM, pp. 49-54.*

(Continued)

*Primary Examiner*—Kamini S Shah
*Assistant Examiner*—Kibrom Gebresilassie
(74) *Attorney, Agent, or Firm*—Ryan, Mason & Lewis, LLP (57) ABSTRACT

The operation of an electronic system comprising a plurality of integrated circuits or other circuit elements is simulated using a software-based development tool that provides a generic framework for simultaneous simulation of multiple circuit elements having potentially different clock speeds, latencies or other characteristics. One or more interfaces provided in the software-based development tool permit registration of processing events associated with one or more of the circuit elements. The software-based development tool is further operative to determine a system clock for a given simulation, and to schedule execution of the associated processing events in a manner that takes into account differences between the system clock and one or more circuit element clocks, so as to maintain consistency in the execution of the processing events relative to the determined system clock.

20 Claims, 4 Drawing Sheets

U.S. PATENT DOCUMENTS

| | | | |
|---|---|---|---|
| 2004/0068706 A1* | 4/2004 | Sivaraman et al. | 716/6 |
| 2004/0102942 A1* | 5/2004 | Rhodes | 703/13 |
| 2004/0181385 A1* | 9/2004 | Milne et al. | 703/14 |
| 2005/0177353 A1* | 8/2005 | Slater | 703/6 |
| 2006/0023691 A1* | 2/2006 | Franchuk et al. | 370/351 |
| 2007/0129928 A1* | 6/2007 | Lin et al. | 703/17 |
| 2010/0057426 A1* | 3/2010 | Reblewski | 703/14 |

OTHER PUBLICATIONS

Over G. D. Nagendra, V. G. Prem Kumar, and B. S. Sheshadri, "Simulation Bridge: A Framework for Multi-processor Simulation", 2002 ACM, pp. 49-54.*

W. H. Hsieh, S. J. Jou, and C. C. Su, "Parallel event-driven MOS timing simulator on distributed memory multiprocessors" IEEE 1996.*

S. W. Keckler, A. Chang, W. S. Lee, S. Chatterjee, W. J. Dally, "Concurrent Event Handling through Multithreading" 1999 IEEE.*

J. Liu, D. Nicol, B. Premore, A. Poplawski, "Performance Prediction of a Parallel Simulator", Apr. 26, 1999.*

W.E. Leland, "On the Self-Similar Nature of Ethernet Traffic," IEEE/ACM Transactions on Networking, pp. 1-46, Feb. 1994.

R. Bhattacharya et al., "Design of 160 Gbps Router with PI40 Switch Fabric and 10G Chipsets," Proceedings of the International Conference on Communications and Broadband Networking, ICBN '03, May 5-7, 2003, Bangalore, India, 4 pages, 2003.

D. Turner et al., "Protocol-Dependent Message-Passing Performance on Linux Clusters," 2002 IEEE International Conference on Cluster Computing (CLUSTER 2002), Chicago, IL, USA, pp. 187-194, Sep. 23-26, 2002.

NetPIPE, http://www.scl.ameslab.gov/netpipe/, pp. 1-2, May 2003.

"Welcome to the Public Netperf Homepage," http://www.netperf.org/netperf/NetperfPage.html, 1 page, Nov. 2003.

TTCP Utility, "Test TCP (TTCP) Benchmarking Tool for Measuring TCP and UDP Performance," http://www.pcausa.com/Utilities/pcattcp.htm, pp. 1-5, Feb. 2003.

* cited by examiner

```
private static final float CURRENT_CLOCK_ROUND_ADD = 0.05F;
...
long        chipCS = 0;
long        systemCS = getSystemClockSpeed();

chipCS = inChip == null ? systemCS : inChip.getClockSpeed();
double cclock = getCurrentClock() *
        ((double)chipCS/(double)systemCS);
cclock += CURRENT_CLOCK_ROUND_ADD;
```

FIG. 4

```
double eventCycle = (double)obj.sim_current_event();
long chipClockSpeed = 0;
chipClockSpeed = cobj == null ? systemClockSpeed_ :
            cobj.getClockSpeed();
eventCycle *=(double)systemClockSpeed_/(double)chipClockSpeed;
double globalClock = getCurrentClock();
double eventTimer = globalClock + eventCycle;

int index = getAscendingOrderPosition(eventTimer);

EventTicket eventTicket = new EventTicket(obj, eventTimer, globalClock,
        relativeFlag);
pendingEvents.add(index, eventTicket);
```

FIG. 5

```
eventQueue = eventSched.nextEvents( eventQueue );

EventTicket eventTicket = (EventTicket)eventQueue.get(0);
double delta = eventTicket.sim_get_event_timer() - getCurrentClock();

runCycles(delta);

//update global clock
incrementClock(delta);

//execute the events
for (int i = 0; i < eventQueue.size(); ++i)
    {
        eventTicket = (EventTicket)eventQueue.get(i);
        event = eventTicket.sim_get_event();
        event.sim_execute_event();
    }
```

FIG. 6

```
List       li = getChips();
double[]   chipsCycles = getChipsCycles();
long       scs = getSystemClockSpeed();

for (int i = 0; i < li.size(); i++)
{
    ChipIf    chip = (ChipIf)li.get(i);
    double    cycles = inCycles *
              ((double)chip.getClockSpeed()/(double)scs);

cycles += chipsCycles[i];

int       intCycles = (int)cycles;
    double    remCycles = cycles - intCycles;

chipsCycles[i] = remCycles;

chip.runCycles(intCycles);
}
```

SIMULATION FRAMEWORK WITH SUPPORT FOR MULTIPLE INTEGRATED CIRCUITS HAVING POTENTIALLY DIFFERING CHARACTERISTICS

FIELD OF THE INVENTION

The present invention relates generally to the design of electronic systems comprising multiple integrated circuits or other circuit elements, and more particularly to techniques for simulating the operation of such systems.

BACKGROUND OF THE INVENTION

In designing and otherwise developing electronic systems comprising multiple integrated circuits, it is common practice for the system operation to be simulated using software-based development tools. Such multiple-chip simulations are useful in determining the extent of any interface issues that may arise within the system due to various operational factors, including clocking, data transfer, etc.

Conventional software-based development tools for simulating multiple-chip systems suffer from a number of significant drawbacks, as outlined below.

One such drawback is that the conventional software-based development tools generally require a separate software implementation for each different type or generation of chip within the multiple-chip system. This requirement results in additional development time and expense. There is generally no reusable simulation code provided that could facilitate the process for multiple-chip systems.

In addition, there is typically no simulation model available that provides sufficient flexibility to deal with multiple chips having differing clock speeds, latencies or other similar characteristics. For example, both clock and event based simulation are usually not supported within any single conventional development tool.

Furthermore, the conventional development tools generally also fail to provide adequate support for external chip "plug-ins" by customers or third party vendors of a given development entity. There is no common platform available for use with all or most of such plug-in chips, and as a result different interfaces are required in order to perform functions such as configuring and running the chips, monitoring statistics and other performance metrics, and analyzing network traffic or other types of data throughput.

It is therefore apparent that a need exists for improved software-based development tools that can provide a simulation framework capable of simultaneous simulation of multiple chips with potentially different clock speeds, latencies or other characteristics.

SUMMARY OF THE INVENTION

The present invention provides in an illustrative embodiment thereof an improved software-based development tool having a simulation framework capable of simultaneous simulation of multiple integrated circuits or "chips" with potentially different clock speeds, latencies or other characteristics. The software-based development tool may be configured to perform functions such as controlling the running of clock cycles in individual chip modules, scheduling chip processing latencies via events, supporting entry points into chip modules for initialization, and cleanup of processing results.

In accordance with one aspect of the invention, one or more interfaces provided in the software-based development tool permit registration of processing events associated with one or more of the circuit elements. The software-based development tool is further operative to determine a system clock for a given simulation, and to schedule execution of the associated processing events in a manner that takes into account differences between the system clock and one or more circuit element clocks so as to maintain consistency in the execution of the processing events relative to the determined system clock.

In the illustrative embodiment, the software-based development tool comprises a simulator control module, a set of interfaces, and circuit element modules each corresponding to an associated one of the circuit elements. The simulator control module includes an event scheduler module. The set of interfaces comprises a simulator runtime interface shared by the plurality of circuit element modules, and a circuit element interface, an event interface and a connection interface for each of the circuit element modules. The simulator runtime interface may comprise one or more Service Provider Interfaces (SPIs), each specifying one or more entry points for the associated processing events.

DETAILED DESCRIPTION OF THE INVENTION

The present invention will be illustrated herein using an exemplary software-based development tool providing a simulation framework for simulating the operation of multiple integrated circuits having potentially differing clock speeds, latencies or other characteristics. It should be understood, however, that the techniques of the invention can be more generally applied to any type of circuit or system design application. The invention does not require the particular elements of the illustrative embodiment, and other elements can be used in addition to or in place of the particular elements shown.

Figure 1A:
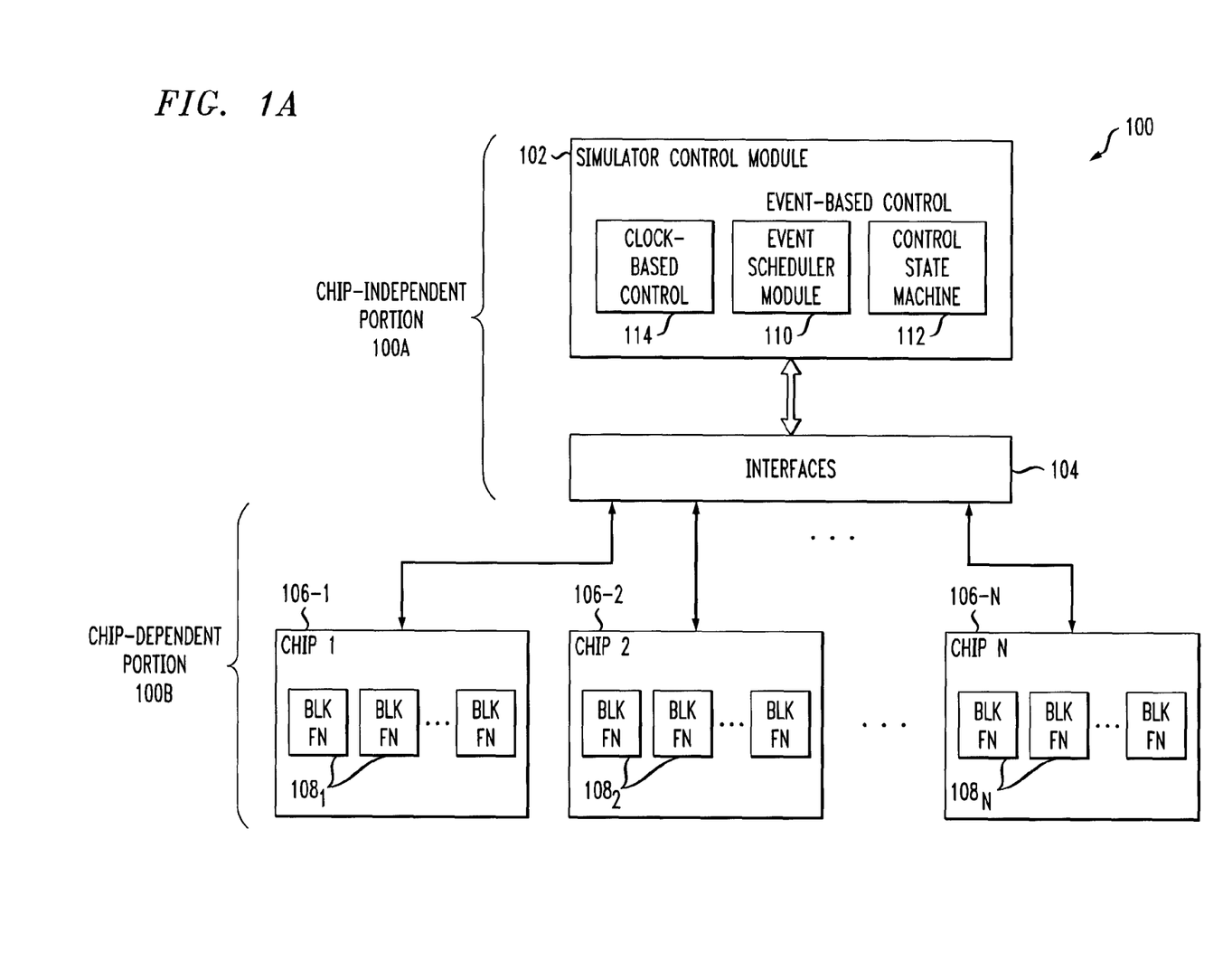
FIG. 1A shows an illustrative embodiment of a software-based development tool configured in accordance with the invention.

Referring now to FIG. 1A, a software-based development tool 100 includes a chip-independent portion 100A and a chip-dependent portion 100B. The chip-independent portion 100A comprises a simulator control module 102 and interfaces 104. The chip-dependent portion 100B comprises chip modules 106-1, 106-2, ... 106-N. The chip modules 106-1, 106-2, ... 106-N include respective block functions denoted $108_1, 108_2, \ldots 108_N$ as shown. The simulator control module 102 includes event-based control comprising an event scheduler module 110 and a control state machine 112, and clock-based control 114.

The term "chip" as used herein refers generally to an integrated circuit or other circuitry block to be simulated in a given system. A chip module denotes a corresponding set of information, characterizing the operation of the chip, that is utilizable in simulating the operation of the chip.

The software-based development tool in the illustrative embodiment is assumed to run at least in part on a general-purpose computer, workstation or other information processing device comprising at least one processor and an associated memory.

The software-based development tool functions described herein are implemented at least in part in the form of software comprising one or more programs stored in the memory of the information processing device and executed by the processor of the information processing device. The configuration and operation of such information processing devices are well-known in the art, and therefore not described in further detail herein.

It is also to be appreciated that the software-based development tool 100 in the illustrative embodiment may further include, in addition to the particular modules shown in the figure, additional modules and other elements of a type commonly found in conventional implementations of such tools. These conventional modules and other elements, being commonly used in the art, will not be described in detail herein.

In accordance with an aspect of the invention, the development tool 100 provides a simulation framework capable of simultaneous simulation of multiple chips with potentially different clock speeds, latencies or other characteristics. More specifically, the development tool 100 in the illustrative embodiment provides support for multiple instances of interconnected chips, whether comprising internally-developed chips associated with a single development entity or "plug-in" chips externally connectable thereto and developed by customers or third party vendors of the given entity. The development tool is configured to perform functions such as controlling the running of clock cycles in individual chip modules, scheduling chip processing latencies via events, supporting entry points into chip modules for initialization, and cleanup of processing results. The simulation framework, as will be described in detail below, provides facilities for execution of clock-based block functions, as well as initialization, cleanup and logging of information to databases.

Advantageously, the development tool 100 in the illustrative embodiment is configured so as to overcome the drawbacks associated with the conventional approaches described previously herein. For example, the development tool 100 is configured to avoid the development of separate software implementations for each different type or generation of chip within a given multiple-chip system, thereby saving development time and expenses. Since the development tool 100 provides a reusable and extensible simulation framework, chip-specific logic can be written utilizing available framework services. Also, the development tool 100 supports both clock and event based simulation, and provides a common platform for accommodating plug-in external chips from customers or third party vendors.

The simulator control module 102 provides the above-described simulation framework in the development tool 100 by loading instances of the chip modules 106 during initialization, invoking runtime interfaces into individual chip modules, and scheduling processing tasks with appropriate latencies via events and cycles.

Figure 1B:
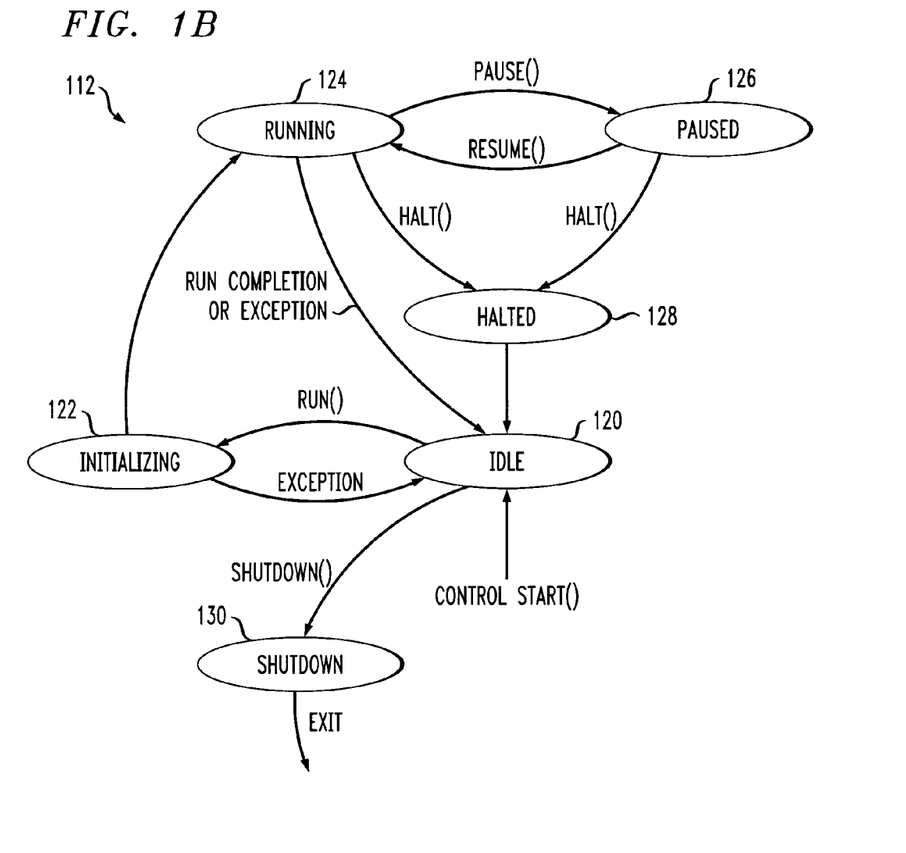
FIG. 1B is a state diagram showing one possible implementation of a control state machine in the software-based development tool of FIG. 1A.

FIG. 1B is a state diagram illustrating the operation of the control state machine 112 in the illustrative embodiment. The state diagram includes an Idle state 120, an Initializing state 122, a Running state 124, a Paused state 126, a Halted state 128, and a Shutdown state 130, with inter-state transitions as shown.

A control start signal causes the control state machine 112 to enter the Idle state 120, from which a run signal causes the state machine to enter the Initializing state 122. From the initializing state 122, the state machine automatically transitions to the Running state 124, unless an exception occurs prior to the automatic transition so as to return the state machine to the Idle state 120. From the Running state 124, run completion or an exception will result in a transition to the Idle state 120, a halt signal will result in a transition to the Halted state 128, and a pause signal will result in a transition to the Paused state 126. From the Halted state 128, the control state machine automatically transitions to the Idle state 120. From the Paused state 126, a resume signal will result in a transition to the Running state 124, and a halt signal will result in a transition to the Halted state 128. From the Idle state 120, a shutdown signal will result in a transition to the Shutdown state 130, and subsequently an exiting of the control state machine.

The particular states and transitions shown in FIG. 1B are intended to merely illustrate one possible implementation of the control state machine 112. Numerous alternative implementations may be used.

Figure 2:
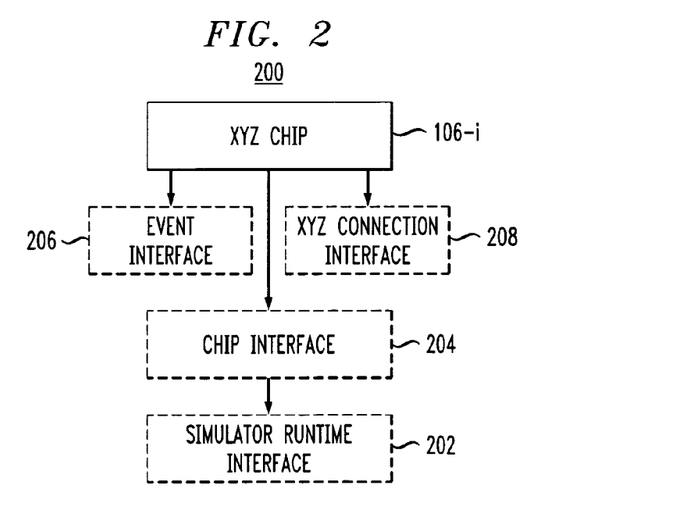
FIG. 2 shows an example of an interface hierarchy utilized in the software-based development tool of FIG. 1A in accordance with the invention.

An interface hierarchy associated with a given one of the chip modules 106-i is shown in FIG. 2, where i is an index taking on a value 1, 2, . . . or N. The given chip module is a module for a particular type or generation of chip, denoted XYZ chip herein for purposes of illustration. The interface elements of the FIG. 2 interface hierarchy 200 include a runtime interface 202 defined for the simulator runtime, a chip interface 204 between the XYZ chip 106-i and the runtime interface 202, an event interface 206 between the XYZ chip 106-i and the event scheduler module 110 of the simulator control module 102, and an XYZ connection interface 208 between the XYZ chip 106-i and one or more of the other chips 106 in the development tool 100.

The interface elements of FIG. 2 may be viewed as being representative of specific elements of the interfaces 104 of FIG. 1A. Each of the other chips 106 may also have corresponding chip interface, event interface and connection interface elements associated therewith, arranged in a similar hierarchy relative to the simulator runtime interface 202.

The connection interfaces 208 for the chip modules 106 facilitate transfer of information between the chip modules. These interfaces may be implemented as generic connection interfaces with entry points for registering a given module as a source or sink, and sending or receiving data. The connection interfaces in the development tool 100 thus simulate bus channels or other interconnections between chips in the corresponding hardware.

The simulator runtime interface 202 is defined for all of the chips that are part of the multiple-chip system to be simulated within the simulation framework provided by the development tool 100. This runtime interface will preferably comprise one or more Service Provider Interfaces (SPIs) specifying various entry points for processing operations to be performed by particular ones of the chips. Examples of such entry points may illustratively include entry points commonly referred to as init, uninit, abort/reset, state change, and is done?, as well other simulation entry points of a type known to those skilled in the art.

In conjunction with a given simulation, the development tool 100 instantiates the particular chips being simulated by invoking entry points into the corresponding chip modules for performance of various functions such as initialization, cleanup, state change notifications, etc.

During an initialization process, the simulator control module 102 determines a system-wide clock speed for all the chips in the multiple-chip system to be simulated. This is done in the illustrative embodiment by querying all the associated chip modules 106 regarding their clock speeds. The chip modules report the requested clock speed information to the simulator control module 102 via their respective chip interfaces 204 and the simulator runtime interface 202. The simulator control module 102 then chooses the fastest clock speed among the reported clock speeds as the clock speed for the multiple-chip system to be simulated, and internally keeps track of system clock ticks.

After the system clock speed has been determined in the manner described above, an individual chip module can query the simulator control module 102 regarding the current number of clock cycles for that chip since the beginning of the simulation. The simulator control module then converts its current internally-maintained system clock into the requested chip clock cycles using appropriate logic.

Figure 3:
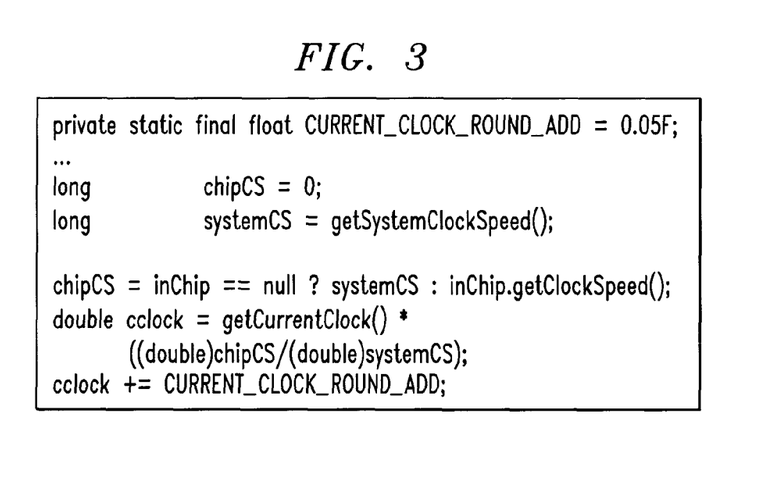
FIGS. 3 through 6 show example program code for simulation-related processes implemented in the software-based development tool of FIG. 1A in accordance with the invention.

FIG. 3 shows example program code for implementing the above-described clock cycle determination process. In the code, the function getSystemClockSpeed returns the speed of a selected system clock and the function getCurrentClock returns the current clock ticks of a global clock which adheres to the selected system clock. The global clock ticks are preferably maintained in a double format in order to keep track of fractional parts during scheduling events.

The individual chip modules in the illustrative embodiment can execute their block functions 108 via events and run cycles. Other suitable mechanisms can also or alternatively be used. Event-based execution of block functions will now be described in conjunction with the program code shown in FIGS. 3, 4 and 5.

For block functions that consume predetermined cycles, the chip modules can register events with the event scheduler module 110 via their corresponding event interfaces 206. This event registration can be done during the above-described initialization as well as during normal running operation.

The simulator control module 102 runs its event scheduler module 110 during runtime, thus allowing the events to run in the order of their respective firing intervals.

During event registration, chip modules specify the event intervals as well as clock speeds of the block functions to which the events correspond. The event scheduler module 110 keeps track of the above-noted global clock adhering to the system clock selected during initialization. As events converted from chip speeds into the system clock expire, the event scheduler module invokes entry points into the chip event block functions so that chip modules can perform operations such as processing data, transferring data, etc.

Figure 4:
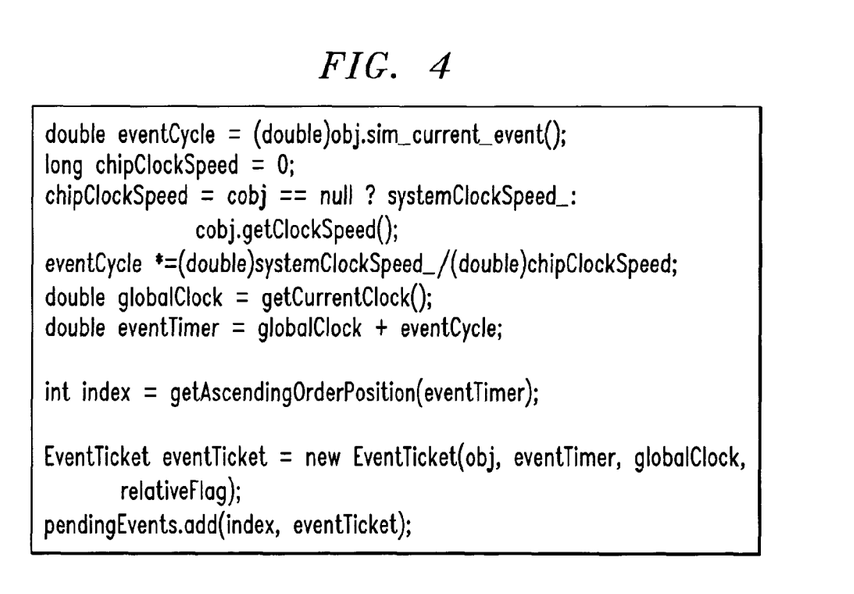

The event scheduler module 110 in conjunction with registration of events by chip modules maintains an array list of pending events, denoted pendingEvents herein, and inserts a new event in manner illustrated in the program code of FIG. 4.

In this example program code, the variable obj refers to the new event that a chip module is registering, and cobj refers to the chip module instance itself. After conversion of the event into system clock cycles, the event is inserted in the pendingEvents list in its proper slot in ascending order, so that the events are subsequently processed in the correct scheduled order.

Figure 5:
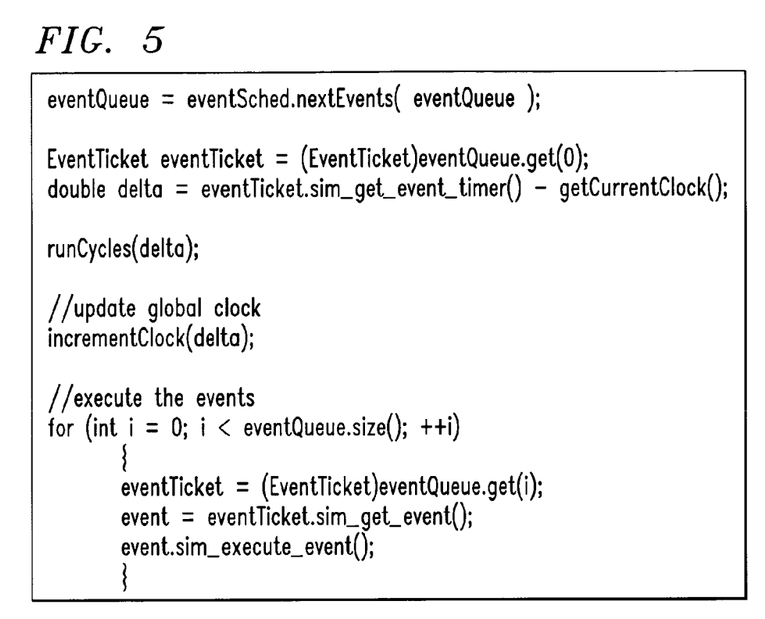

FIG. 5 shows example program code utilized by the simulator control module 102 to process the scheduled events. The function nextEvents returns a list of all the events scheduled to be "fired" or otherwise initiated at the same time at the top of the pending list. First, a difference between the current global clock and the time of the scheduled events is determined. Then cycles are run for the difference, the global clock is advanced, and the events are fired using their associated execute process so that the chip module block functions can perform their scheduled tasks.

As indicated above, run cycles is another mechanism that is used by the chip modules 106 to execute their block functions 108. This aspect of the invention will now be described with reference to the program code of FIG. 6.

Between the events to be fired, the simulator control module invokes entry points into the chip modules to run their previously unscheduled cycles, also referred to as idle cycles. All chip modules may have one or more entry points defined to run the idle cycles, for example, in their implementation of the chip interface 204.

Figure 6:
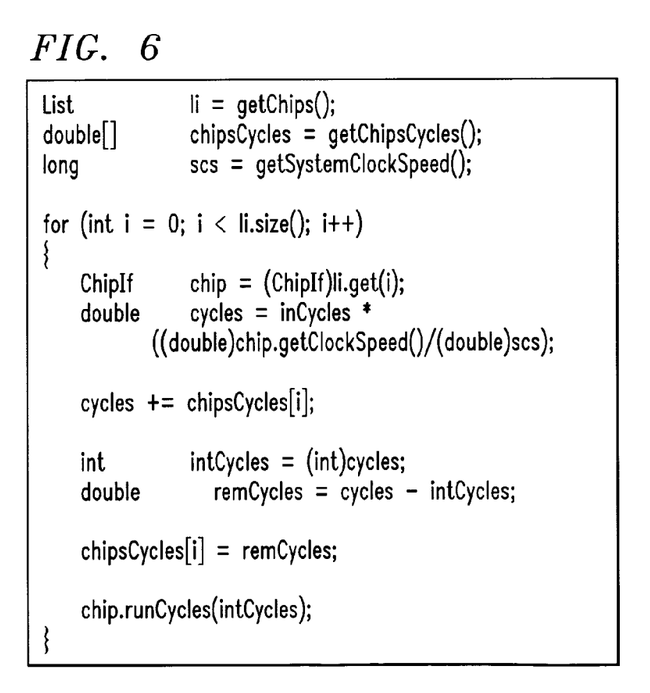

The program code of FIG. 6 illustrates the manner in which cycles for chip modules may be calculated. The variable inCycles in the program code denotes system cycles, which are converted to chip cycles in a manner that keeps track of any previously unscheduled cycles. The function getChipsCycles() returns a reference to an array of unscheduled or residual cycles for all the chips that are being simulated.

It should be noted that when chip events and run cycles are invoked by the simulator control module 102, the module keeps track of residual portions of the converted clocks in system clock ticks so that any such residual portions are accumulated and accounted for in subsequent operations. This approach ensures that conversion of the residual portions will not result in any loss in timing accuracy.

The above-described operation of the development tool 100 provides basic operations allowing emulation of chip functionality in a given simulation. Numerous other services can be provided, such as the logging or tracing of data transfers in database transactions, keeping track of statistics to be logged or displayed, etc. As indicated previously, services of a type provided in conventional software-based development tools may also be included.

In accordance with another aspect of the invention, a generic process can be provided which allows definition of particular chips and their associated entry points. Such a process can be utilized within the development tool 100 to determine the particular chip modules and associated information to be loaded in running a given simulation. As a more particular example, a process of this type can be implemented using extensible markup language (XML) or other suitable programming language to define chips and associated entry points in a manner that facilitates the loading of such information into the development tool 100.

The illustrative embodiment of the invention as described above advantageously provides an improved software-based development tool which can serve as a framework for simulation of multiple-chip systems having different clock speeds, latencies or other characteristics. The development tool provides significantly enhanced flexibility, without requiring substantial modification to support different types or generations of chips. It can be implemented using a wide variety of different programming languages. Moreover, it facilitates multiple-chip system development both internally, using chip designs of a given development entity, as well as externally, using one or more plug-in chips from customers or third-party vendors of the given development entity.

As mentioned previously, one or more software programs for implementing the development tool functionality described herein may be stored in a memory of an information processing device and executed by a processor of that device.

It should again be emphasized that the above-described embodiment is intended to be illustrative only. For example, alternative embodiments may be configured which utilize different modules or other system elements, different types of program code, and different simulation techniques than those specifically described herein.

These and numerous other alternative embodiments within the scope of the following claims will be apparent to those skilled in the art.

What is claimed is:

1. A method of simulating the operation of an electronic system comprising a plurality of circuit elements, utilizing a software-based development tool, the method comprising the steps of:

providing in the software-based development tool an interface permitting registration of processing events associated with one or more of the plurality of circuit elements;

determining a system clock for a given simulation;

scheduling execution of the associated processing events in a manner that takes into account differences between the system clock and one or more circuit element clocks so as to maintain consistency in the execution of the processing events relative to the determined system clock; and executing the processing events in the manner determined in the scheduling step to simulate the operation of the electronic system;

wherein the software-based development tool stores for the circuit elements respective indications of previously unscheduled clock cycles and such clock cycles are automatically run in conjunction with execution of corresponding ones of the processing events.

2. The method of claim 1 wherein at least a subset of the circuit elements each comprise one or more integrated circuits.

3. The method of claim 1 wherein at least one of the plurality of circuit elements has a clock speed that differs from that of at least another one of the circuit elements.

4. The method of claim 1 wherein at least one of the plurality of circuit elements has a processing event latency that differs from that of at least another one of the circuit elements.

5. The method of claim 1 wherein the software-based development tool runs at least in part on an information processing device comprising a processor and an associated memory.

6. The method of claim 1 wherein the software-based development tool comprises a simulator control module, a set of interfaces, and circuit element modules each corresponding to an associated one of the circuit elements.

7. The method of claim 6 wherein the simulator control module comprises an event scheduler module.

8. The method of claim 6 wherein the set of interfaces comprises a simulator runtime interface shared by the plurality of circuit element modules and a separate circuit element interface for each of the circuit element modules.

9. The method of claim 8 wherein the simulator runtime interface comprises one or more Service Provider Interfaces (SPIs) each specifying one or more entry points for the associated processing events.

10. The method of claim 6 wherein each of the circuit element modules comprises a plurality of clock-based block functions executable in conjunction with the given simulation.

11. The method of claim 6 wherein the set of interfaces comprises, for at least a given one of the circuit element modules, an event interface between the circuit element module and an event scheduler associated with the simulator control module.

12. The method of claim 6 wherein the set of interfaces comprises, for at least a given one of the circuit element modules, a connection interface between the circuit element module and one or more corresponding interfaces associated with one or more of the other circuit element modules.

13. The method of claim 1 wherein at least one of the circuit elements comprises a plug-in circuit element associated with an entity other than an entity associated with one or more of the other circuit elements.

14. The method of claim 1 wherein information characterizing the associated processing events of one or more of the circuit elements is defined at least in part utilizing extensible markup language (XML) in a manner that facilitates the loading of such information into the software-based development tool.

15. The method of claim 1 wherein the step of determining a system clock for a given simulation further comprises determining the system clock as a clock having the highest clock speed among clock speeds of the plurality of circuit elements.

16. The method of claim 1 wherein circuit element modules corresponding to the respective circuit elements are configured to query a simulator control module for information regarding a number of cycles of a circuit element clock associated with a given state of the system clock.

17. The method of claim 1 wherein a current global clock based on the determined system clock is monitored relative to one or more circuit element clocks.

18. The method of claim 1 wherein unscheduled cycles of one or more circuit element clocks are determined and a simulator control module invokes entry points into associated circuit element modules to run one or more of the unscheduled cycles.

19. An apparatus for simulating the operation of an electronic system comprising a plurality of circuit elements, the apparatus comprising:

an information processing device having a processor and a memory;

the information processing device implementing a software-based development tool providing an interface permitting registration of processing events associated with one or more of the plurality of circuit elements;

wherein the software-based development tool is further operative to determine a system clock for a given simulation, to schedule execution of the associated processing events in a manner that takes into account differences between the system clock and one or more circuit element clocks so as to maintain consistency in the execution of the processing events relative to the determined system clock, and to execute the processing events in accordance with the schedule to simulate the operation of the electronic system; and wherein the software-based development tool stores for the circuit elements respective indications of previously unscheduled clock cycles and such clock cycles are automatically run in conjunction with execution of corresponding ones of the processing events.

20. An article of manufacture comprising a storage medium containing one or more software programs for use in simulating the operation of an electronic system comprising a plurality of circuit elements, utilizing a software-based development tool, wherein the one or more software programs when executed implement the steps of:

providing in the software-based development tool an interface permitting registration of processing events associated with one or more of the plurality of circuit elements;

determining a system clock for a given simulation; and scheduling execution of the associated processing events in a manner that takes into account differences between the system clock and one or more circuit element clocks so as to maintain consistency in the execution of the processing events relative to the determined system clock; and executing the processing events in the manner determined in the scheduling step to simulate the operation of the electronic system;

wherein the software-based development tool stores for the circuit elements respective indications of previously unscheduled clock cycles and such clock cycles are automatically run in conjunction with execution of corresponding ones of the processing events.

* * * * *